(12) United States Patent
Chinthakindi et al.

(10) Patent No.: US 7,968,929 B2
(45) Date of Patent: Jun. 28, 2011

(54) ON-CHIP DECOUPLING CAPACITOR STRUCTURES

(75) Inventors: Anil K. Chinthakindi, Haymarket, VA (US); Eric Thompson, Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 457 days.

(21) Appl. No.: 11/834,961

(22) Filed: Aug. 7, 2007

(65) Prior Publication Data

US 2009/0039465 A1    Feb. 12, 2009

(51) Int. Cl.
*H01L 27/108* (2006.01)
*H01L 29/94* (2006.01)

(52) U.S. Cl. ........ 257/307; 257/300; 257/301; 257/302; 257/303; 257/304; 257/305; 257/306; 257/308; 257/309; 257/532; 257/535; 257/750; 257/E23.142; 257/E23.144; 257/E23.145; 257/E27.092; 361/306.3

(58) Field of Classification Search ................. 257/750, 257/535, E27.092, 301, 307, E23.142, E23.144, 257/E23.145, 532, 300, 302, 303, 304, 305, 257/306, 308, 309; 361/306.3
See application file for complete search history.

(56) References Cited

U.S. PATENT DOCUMENTS

| | | | |
|---|---|---|---|
| 3,862,017 A | 1/1975 | Tsunemitsu et al. | |
| 4,961,104 A | 10/1990 | Hirakawa | |
| 5,275,963 A | 1/1994 | Cederbaum et al. | |
| 5,298,782 A | 3/1994 | Sundaresan | |
| 5,939,766 A | 8/1999 | Stolmeijer et al. | |
| 6,278,149 B1* | 8/2001 | Sato et al. | 257/301 |
| 6,385,033 B1* | 5/2002 | Javanifard et al. | 361/306.2 |
| 6,500,724 B1 | 12/2002 | Zurcher et al. | |
| 6,573,604 B1* | 6/2003 | Kajita | 257/758 |
| 6,700,203 B1 | 3/2004 | Cabral, Jr. et al. | |
| 6,777,737 B2* | 8/2004 | Mandelman et al. | 257/305 |
| 6,905,897 B1* | 6/2005 | Hsu | 438/18 |
| 7,195,971 B2 | 3/2007 | Bernstein et al. | |
| 2004/0173839 A1* | 9/2004 | Casarotto et al. | 257/315 |
| 2004/0232520 A1* | 11/2004 | Tsau | 257/532 |
| 2005/0121722 A1* | 6/2005 | Oyamatsu | 257/347 |
| 2007/0123015 A1 | 5/2007 | Chinthakindi et al. | |

* cited by examiner

*Primary Examiner* — Matthew E Warren
*Assistant Examiner* — David Z Chen
(74) *Attorney, Agent, or Firm* — Ohlandt, Greeley, Ruggiero & Perle, LLP; Joseph P. Abate, IBM Atty.

(57) ABSTRACT

The present disclosure provides on-chip decoupling capacitor structures having trench capacitors integrated with a passive capacitor formed in the back-end-of-line wiring to provide an improved overall capacitance density. In some embodiments, the structure includes at least one deep trench capacitor and a passive capacitor formed in at least two back-end-of-line wiring levels. The trench and passive capacitors are in electrical communication through one of the wiring levels. In other embodiments, the structure includes at least one deep trench capacitor, a first back-end-of-line wiring level, and a second back-end-of-line wiring level. The deep trench capacitor with a dielectric that has an upper edge that terminates at a lower surface of a shallow trench isolation region. The first wiring level is in electrical communication with the trench capacitor. The second wiring level is vertically electrically connected to the first wiring level by vertical connectors so as to form a passive capacitor.

6 Claims, 4 Drawing Sheets

ON-CHIP DECOUPLING CAPACITOR STRUCTURES

BACKGROUND OF INVENTION

The present disclosure relates to integrated circuit (IC) structures in complementary metal oxide semiconductor (CMOS) circuits. More particularly, the present disclosure relates to on-chip decoupling capacitor structures having trench decoupling capacitors integrated with a passive decoupling capacitor formed in the back-end-of-line (BEOL) wiring of the circuit.

One goal for semiconductor designers is to design highly reliable, super high performance CMOS circuits with ever increasing functionality requirements, while consuming the lowest possible power. This becomes more important for low power battery operated devices where battery-operating lifetime is crucial.

In this mode of operation, circuit designers face a number of challenges to insure high signal integrity within the chip and the semiconductor package. Simultaneous switching through the input and output (I/O) pins give to current "noise" spike within a specified time, severely degrading the signal integrity. The signal integrity is jeopardized mainly by the "noise" on the power and ground planes due to the capacitance coupling between power and signal lines.

To insure the system reliability against such deleterious effects, decoupling capacitors, known as DECAPS, are added to the power and ground planes to provide an AC ground for the noise and provide a stable DC voltage.

One current methodology for embedding a DECAP on a microprocessor is to form a trench-type capacitor that is made directly in the silicon wafer and the sidewalls of the trench are used for the capacitor dielectric. Such trench-type capacitors offer higher capacitance densities over the planar capacitors and lower leakage current. Unfortunately, the area density of deep trench DECAPS is limited by the thickness of the substrate.

Another current methodology for embedding a DECAP on a microprocessor is to form a passive decoupling capacitor on the surface of the silicon wafer. Unfortunately, such wire-based DECAPS occupy chip volume that is valuable for wiring of other devices to the microprocessor.

Accordingly, there is a continuing need in the integrated circuit industry for increased decoupling capacitance beyond that currently available.

BRIEF DESCRIPTION OF THE INVENTION

The present disclosure provides on-chip decoupling capacitor structures having trench capacitors integrated with a passive capacitor formed in the back-end-of-line wiring to provide an improved overall capacitance density.

An on-chip decoupling capacitor structure is provided that includes at least one deep trench capacitor and a passive capacitor formed in at least two back-end-of-line wiring levels. The at least one deep trench capacitor and the passive capacitor are in electrical communication through one of the at least two back-end-of-line wiring levels.

An on-chip decoupling capacitor structure is also provided that includes at least one deep trench capacitor, a first back-end-of-line wiring level, and a second back-end-of-line wiring level. The deep trench capacitor has a shallow trench isolation region, a doped region, an inner electrode, and a dielectric between the doped region and the inner electrode. The dielectric has an upper edge that terminates at a lower surface of the shallow trench isolation region. The first wiring level is in electrical communication with the at least one deep trench capacitor. The second back-end-of-line wiring level is vertically electrically connected to the first back-end-of-line wiring level by vertical connectors so as to form a passive capacitor.

The above-described and other features and advantages of the present disclosure will be appreciated and understood by those skilled in the art from the following detailed description, drawings, and appended claims.

DETAILED DESCRIPTION OF THE INVENTION

Figure 1:
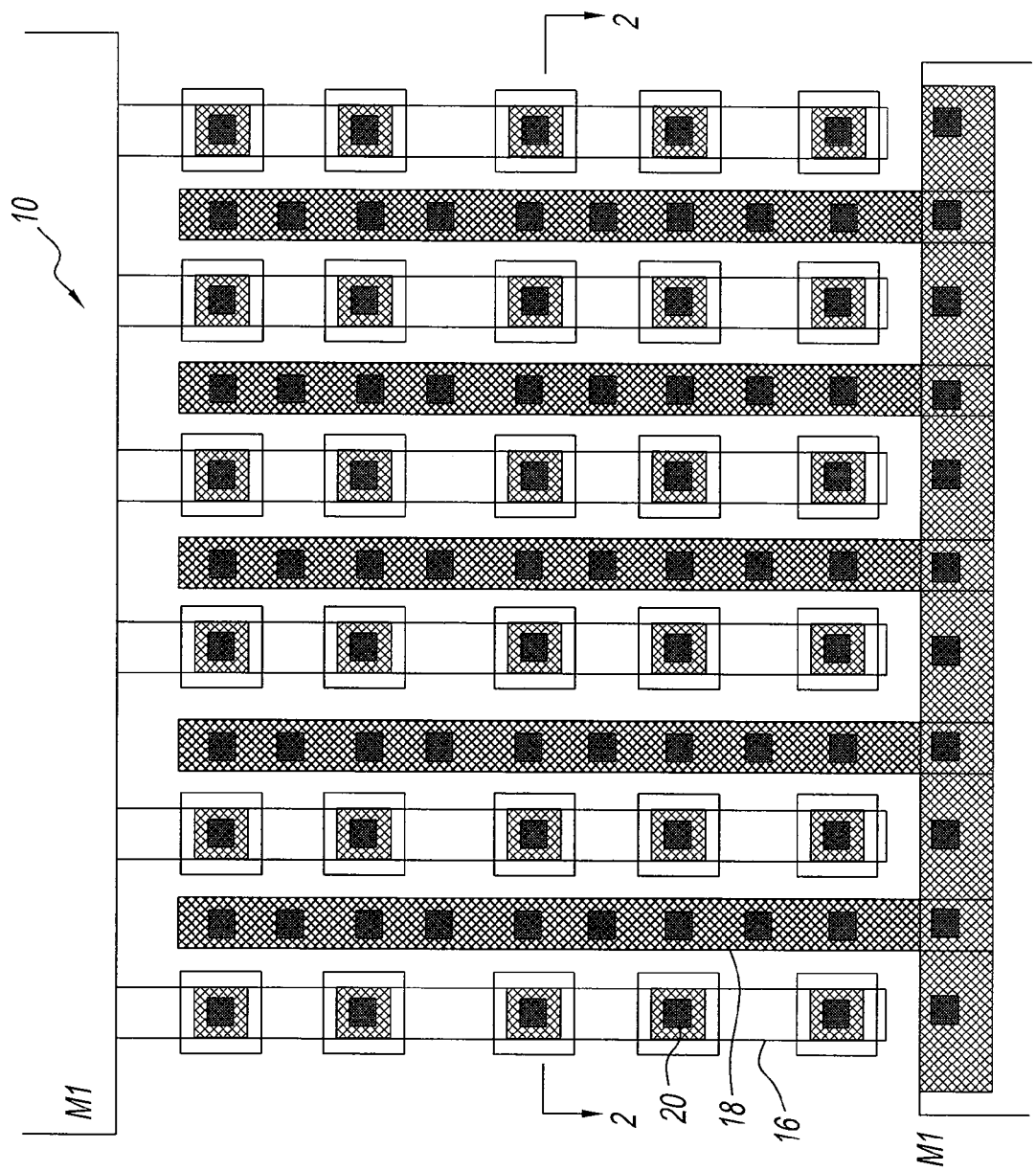
FIG. 1 is a top view of a first exemplary embodiment of a complementary metal oxide semiconductor (CMOS) circuit according to the present disclosure.
Figure 2:
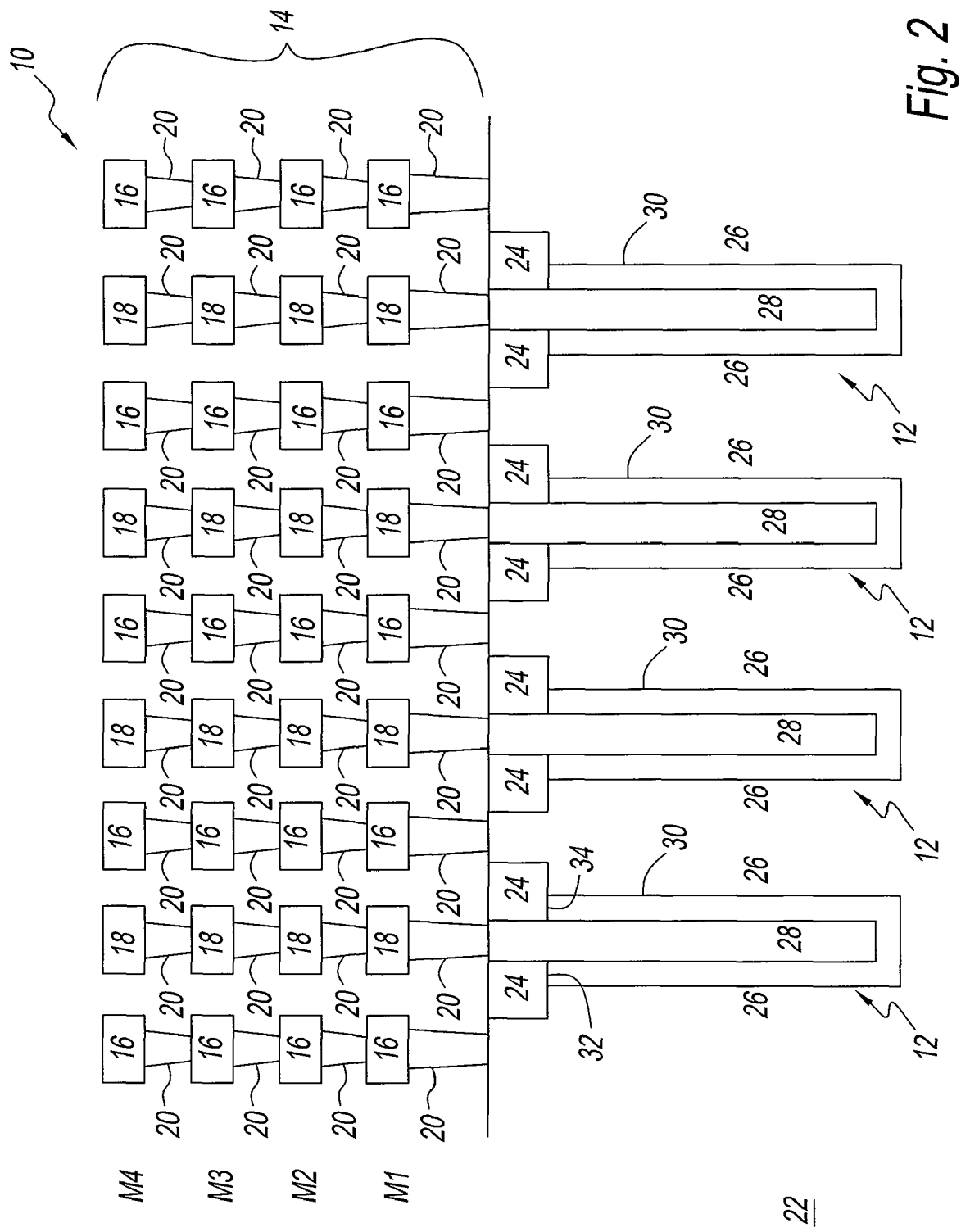
FIG. 2 is a partial sectional view of the circuit of FIG. 1 taken along lines 2-2.

Referring to the drawings and in particular to FIGS. 1 and 2, an exemplary embodiment of complementary metal oxide semiconductor (CMOS) circuit according to the present disclosure is illustrated by way of reference numeral 10. Advantageously, circuit 10 includes one or more deep trench capacitors 12 and a passive capacitor 14 formed in the back-end-of-line (BEOL) wiring of the circuit.

It has been found by the present disclosure that the combination of capacitors 12,14 provide circuit 10 with a larger capacitance density than previously possible. Further, circuit 10 uses the same interconnect layer (M1) in the BEOL wiring for interconnecting capacitors 12, 14 to one another.

In the illustrated embodiment, passive capacitor 14 is formed using the vertical natural capacitance (VNC) of the BEOL wires. FIG. 1 shows a top view of an embodiment of passive capacitor 14 having two interdigitated electrodes 16 and 18. Passive capacitor 14 includes two or more interconnect layers tied together with vertical connectors 20 placed in vias.

In the illustrated embodiment, passive capacitor 14 includes four interconnect layers M1, M2, M3, and M4 tied together by connectors 20. However, it is contemplated by the present disclosure for passive capacitor 14 to have any desired number of interconnect layers, with at least two being the minimum. Advantageously, both electrodes 16, 18 and vertical connectors 20 contribute to the capacitance of passive capacitor 14.

Circuit 10 includes an Si-containing semiconductor substrate 22 having deep trench capacitors 12 defined therein and passive capacitor 14 defined thereon.

Illustrative examples of Si-containing materials that can be employed as substrate 22 include, but are not limited to: Si, SiGe, SiC, SiGeC, and layered semiconductors such as Si/SiGe, a silicon-on-insulator (SOI) or a SiGe-on-insulator (SGOI).

As known in the art, deep trench capacitors 12 include a shallow trench isolation (STI) region 24, a doped region 26, an inner electrode 28 within the trench, and a dielectric 30 between the doped region 26 and the inner electrode 28. STI region 24 comprises an oxide insulator such as low pressure TEOS (tetraethylorthosilicate), High Density Plasma (HDP) oxide or, like oxides and can be formed in any known manner.

Advantageously, dielectric 30 has an upper edge 32 that terminates at a lower surface 34 of STI region 24. Specifically, circuit 10 is manufactured by forming the trench and dielectric 26 for the deep trench capacitor 12 before formation of STI regions 24. Since STI region 24 is formed after formation of dielectric 30, the upper edge 32 of the dielectric terminates at the lower surface 34 of STI region 24.

Some of connectors 20 are in electrical communication with wiring (not shown) on the surface of substrate 22, while other contacts 20 are in electrical communication with deep trench capacitors 12. In this manner, circuit 10 utilizes the same metal layer M1 formed in typical back-end-of-line (BEOL) processes to interconnect capacitors 12, 14 to capture the capacitance of both capacitors 12 and 14.

In the illustrated embodiment, deep trench capacitor 12 has a capacitance per unit area of about 60 femto-Farad per square micro-meter (fF/µm2), while passive capacitor 14 has a capacitance per unit area of about 5 fF/µm2. Accordingly, it has been determined by the present disclosure that integrating the deep trench and passive capacitors 12, 14 provides for approximately a five percent increase in capacitance density over circuits having only deep trench capacitors 12.

Figure 3:
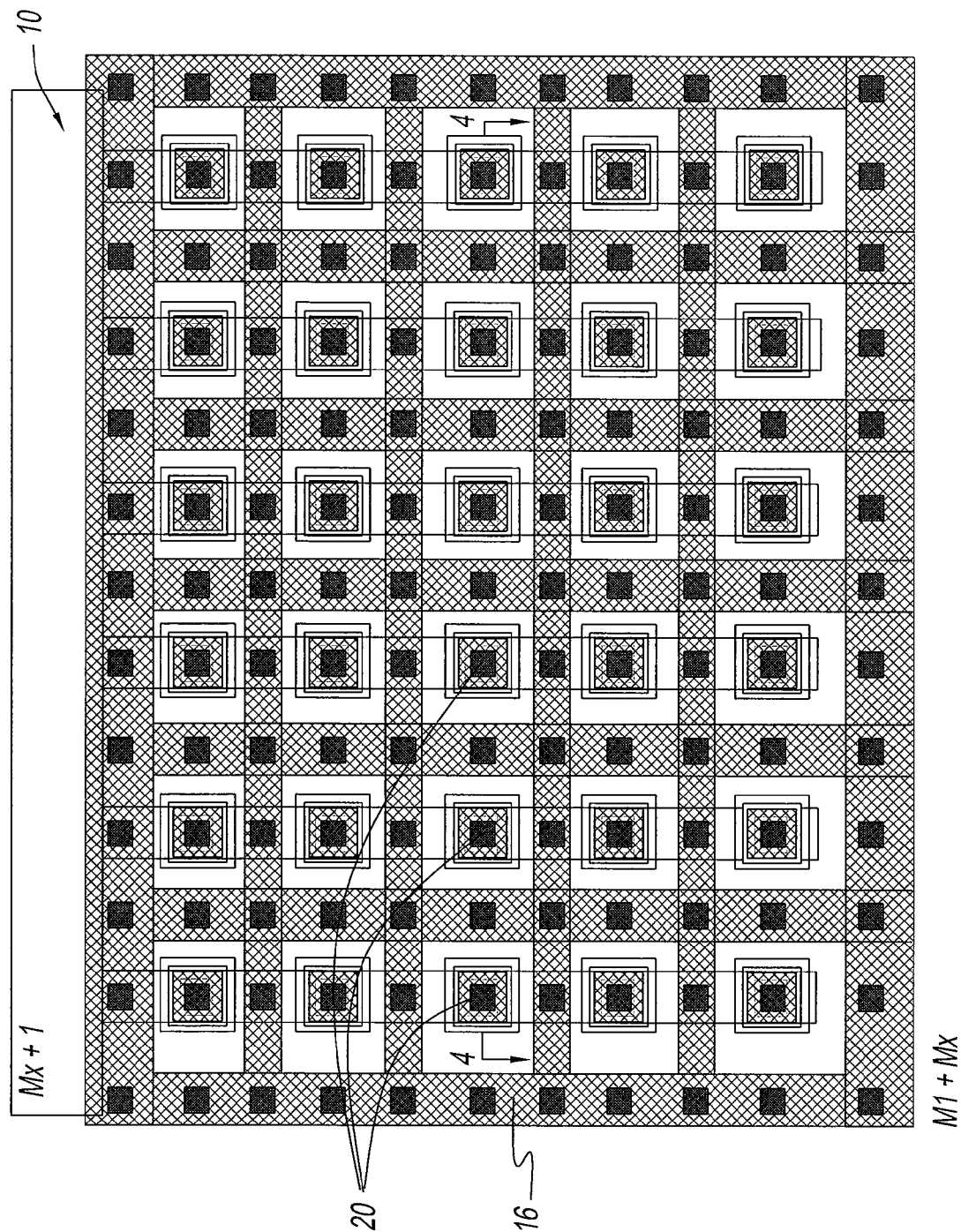
FIG. 3 is a top view of a second exemplary embodiment of a complementary metal oxide semiconductor (CMOS) circuit according to the present disclosure.
Figure 4:
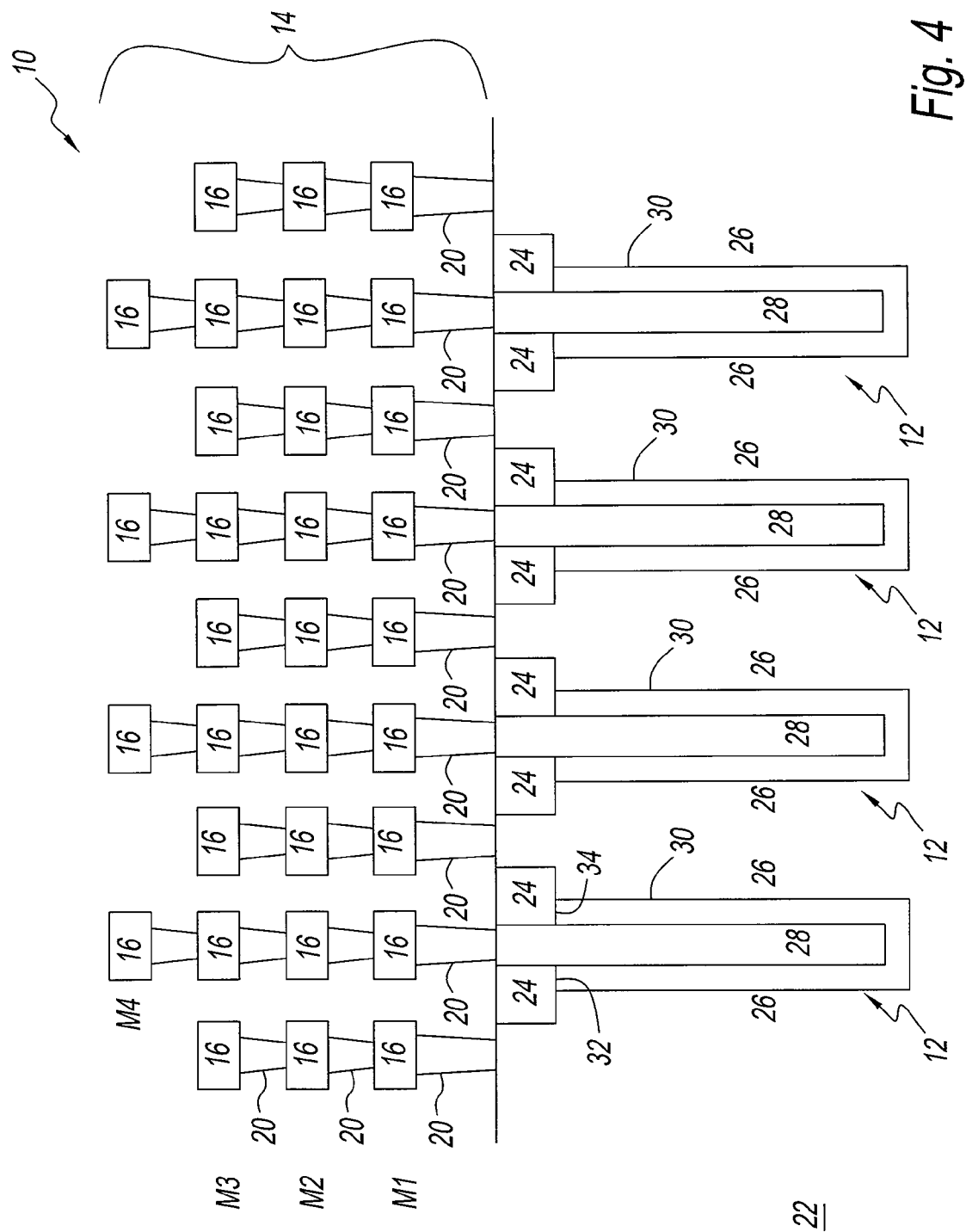
FIG. 4 is a partial sectional view of the circuit of FIG. 3 taken along lines 4-4.

Referring now to FIGS. 3 and 4, an alternate configuration of the circuit 10 of FIGS. 1 and 2 is shown. Again, circuit 10 includes one or more deep trench capacitors 12 and a passive capacitor 14 formed in the back-end-of-the-line (BEOL) wiring of the circuit, where the passive capacitor is formed using the vertical natural capacitance (VNC) of the BEOL wires. In this embodiment, passive capacitor 14 has a single electrode 16 instead of the interdigitated configuration of FIGS. 1 and 2.

In the illustrated embodiment, passive capacitor 14 includes four interconnect layers M1, M2, M3, and M4 tied together by connectors 20. However, it is contemplated by the present disclosure for passive capacitor 14 to have any desired number of interconnect layers, with at least two being the minimum. Advantageously, both electrode 16 and vertical connectors 20 contribute to the capacitance of passive capacitor 14.

The terms "first", "second", "third", "upper", "lower", and the like may be used herein to modify various elements. These modifiers do not imply a spatial, sequential, or hierarchical order to the modified elements unless specifically stated.

While the present disclosure has been described with reference to one or more exemplary embodiments, it will be understood by those skilled in the art that various changes may be made and equivalents may be substituted for elements thereof without departing from the scope of the present disclosure. In addition, many modifications may be made to adapt a particular situation or material to the teachings of the disclosure without departing from the scope thereof. Therefore, it is intended that the present disclosure not be limited to the particular embodiment(s) disclosed as the best mode contemplated, but that the disclosure will include all embodiments falling within the scope of the appended claims.

What is claimed is:

1. An on-chip decoupling capacitor structure, comprising:
   at least one deep trench capacitor having a shallow trench isolation region, a doped region, an inner electrode, and a dielectric between said doped region and said inner electrode, said dielectric having an upper edge that terminates at a lower surface of said shallow trench isolation region;
   a first back-end-of-line wiring level in electrical communication with said at least one deep trench capacitor; and
   a second back-end-of-line wiring level being vertically electrically connected to said first back-end-of-line wiring level by vertical connectors, said first and second back-end-of-line wiring levels and vertical connectors defining at least two interdigitated electrodes so as to form a passive capacitor.

2. The structure of claim 1, wherein each of said first and second back-end-of-line wiring levels comprise a single electrode.

3. The structure of claim 1, wherein said shallow trench isolation region comprises an oxide insulator.

4. The structure of claim 3, wherein said oxide insulator comprises low pressure TEOS (tetraethylorthosilicate), High Density Plasma (HDP) oxide, like oxides, and any combinations thereof.

5. The structure of claim 1, further comprising a plurality of back-end-of-line wiring levels vertically electrically connected to one another by said vertical connectors so as to form said passive capacitor.

6. The structure of claim 1, further comprising an Si-containing semiconductor substrate said at least one deep trench capacitor being defined in said semiconductor substrate, said first back-end-of-line wiring level being defined on said semiconductor substrate, and said second back-end-of-line wiring level being defined on said first back-end-of-line wiring level.

* * * * *